United States Patent
Pinarbasi

(10) Patent No.: US 9,263,667 B1
(45) Date of Patent: Feb. 16, 2016

(54) METHOD FOR MANUFACTURING MTJ MEMORY DEVICE

(71) Applicant: Spin Transfer Technologies, Inc., Freemont, CA (US)

(72) Inventor: Mustafa Pinarbasi, Morgan Hill, CA (US)

(73) Assignee: SPIN TRANSFER TECHNOLOGIES, INC., Fremont, CA (US)

( * ) Notice: Subject to any disclaimer, the term of this patent is extended or adjusted under 35 U.S.C. 154(b) by 13 days.

(21) Appl. No.: 14/341,185

(22) Filed: Jul. 25, 2014

(51) Int. Cl.
*H01L 29/82* (2006.01)
*H01L 43/12* (2006.01)
*H01L 43/10* (2006.01)
*H01L 43/02* (2006.01)
*H01L 43/08* (2006.01)

(52) U.S. Cl.
CPC ............... *H01L 43/12* (2013.01); *H01L 43/02* (2013.01); *H01L 43/08* (2013.01); *H01L 43/10* (2013.01)

(58) Field of Classification Search
CPC ..... H01L 43/08; H01L 29/82; H01L 23/5226; H01L 23/528; H01L 27/222; H01L 43/065; G11C 11/16
USPC ........................ 257/421–427, E29.323; 438/3
See application file for complete search history.

(56) References Cited

U.S. PATENT DOCUMENTS

| | | |
|---|---|---|
| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |

(Continued)

FOREIGN PATENT DOCUMENTS

| | | |
|---|---|---|
| CA | 2766141 A1 | 1/2011 |
| EP | 1345277 A1 | 9/2003 |

(Continued)

OTHER PUBLICATIONS

Andrew Kent, et al.; U.S. Appl. No. 61/715,111, filed Oct. 17, 2012, entitled "Inverted Orthogonal Spin Transfer Layer Stack".

(Continued)

*Primary Examiner* — Jami M Valentine
(74) *Attorney, Agent, or Firm* — Kaye Scholer LLP

(57) ABSTRACT

A method for manufacturing MTJ pillars for a MTJ memory device. The method includes depositing multiple MTJ layers on a substrate, depositing a hard mask on the substrate and coating a photoresist on the hard mask. Further, alternating steps of reactive ion etching and ion beam etching are performed to isolate MTJ pillars and expose side surfaces of the MTJ layers. An insulating layer is the applied to protect the side surfaces of the MTJ layers. A second insulating layer is deposited before the device is planarized using chemical mechanical polishing.

20 Claims, 10 Drawing Sheets

(56) References Cited

U.S. PATENT DOCUMENTS

| | | | |
|---|---|---|---|
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | de Felipe et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,958,927 B1 | 10/2005 | Nguyen et al. |
| 6,967,863 B2 | 11/2005 | Huai |
| 6,969,895 B2 | 11/2005 | Han et al. |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,335,960 B2 | 2/2008 | Han et al. |
| 7,351,594 B2 | 4/2008 | Bae et al. |
| 7,352,021 B2 | 4/2008 | Bae et al. |
| 7,449,345 B2 | 11/2008 | Horng et al. |
| 7,476,919 B2 | 1/2009 | Hong et al. |
| 7,573,737 B2 | 8/2009 | Kent et al. |
| 7,619,431 B2 | 11/2009 | De Wilde et al. |
| 7,911,832 B2 | 3/2011 | Kent et al. |
| 7,936,595 B2 | 5/2011 | Han et al. |
| 7,986,544 B2 | 7/2011 | Kent et al. |
| 8,279,666 B2 | 10/2012 | Dieny et al. |
| 8,334,213 B2 | 12/2012 | Mao |
| 8,363,465 B2 | 1/2013 | Kent et al. |
| 8,492,881 B2 | 7/2013 | Kuroiwa et al. |
| 8,535,952 B2 | 9/2013 | Ranjan et al. |
| 8,574,928 B2 | 11/2013 | Satoh et al. |
| 8,617,408 B2 | 12/2013 | Balamane |
| 8,716,817 B2 * | 5/2014 | Saida ............... G11C 11/16 257/421 |
| 2002/0090533 A1 | 7/2002 | Zhang et al. |
| 2002/0105823 A1 | 8/2002 | Redon et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0242501 A1 | 10/2007 | Hung et al. |
| 2008/0049488 A1 | 2/2008 | Rizzo |
| 2008/0112094 A1 | 5/2008 | Kent et al. |
| 2008/0259508 A2 | 10/2008 | Kent et al. |
| 2008/0297292 A1 | 12/2008 | Viala et al. |
| 2009/0072185 A1 | 3/2009 | Raksha et al. |
| 2009/0091037 A1 * | 4/2009 | Assefa ............... H01L 43/12 257/773 |
| 2009/0098413 A1 | 4/2009 | Kanegae |
| 2010/0124091 A1 | 5/2010 | Cowburn |
| 2010/0271870 A1 | 10/2010 | Zheng et al. |
| 2011/0032645 A1 * | 2/2011 | Noel ............... G01R 33/098 360/326 |
| 2011/0133298 A1 | 6/2011 | Chen et al. |
| 2012/0069649 A1 | 3/2012 | Ranjan et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 * | 11/2012 | Son ............... H01L 43/08 257/421 |
| 2013/0021841 A1 | 1/2013 | Zhou et al. |
| 2013/0244344 A1 * | 9/2013 | Malmhall ............... B82Y 10/00 438/3 |
| 2013/0270661 A1 | 10/2013 | Yi et al. |
| 2013/0341801 A1 | 12/2013 | Satoh et al. |
| 2014/0042571 A1 | 2/2014 | Gan et al. |
| 2014/0070341 A1 | 3/2014 | Beach et al. |
| 2014/0103472 A1 | 4/2014 | Kent et al. |

FOREIGN PATENT DOCUMENTS

| | | |
|---|---|---|
| FR | 2817998 A1 | 6/2002 |
| FR | 2832542 A1 | 5/2003 |
| FR | 2910716 A1 | 6/2008 |
| JP | H10-4012 A | 1/1998 |
| JP | H11-120758 A | 4/1999 |
| JP | H11-352867 A | 12/1999 |
| JP | 2001-195878 A | 7/2001 |

(56) References Cited

FOREIGN PATENT DOCUMENTS

| | | |
|---|---|---|
| JP | 2002-261352 A | 9/2002 |
| JP | 2002-357489 A | 12/2002 |
| JP | 2003-318461 A | 11/2003 |
| JP | 2005-150482 A | 6/2005 |
| JP | 2005-535111 A | 11/2005 |
| JP | 2006-128579 A | 5/2006 |
| JP | 2008-524830 A | 7/2008 |
| JP | 2009-027177 A | 2/2009 |
| WO | WO-2009-080636 A1 | 7/2009 |
| WO | WO-2011-005484 A2 | 1/2011 |

OTHER PUBLICATIONS

Mustafa Pinarbasi, et al.; U.S. Appl. No. 14/242,419, filed Apr. 1, 2014, entitled "Magnetic Tunnel Junction for MRAM Device".

Mustafa Pinarbasi, et al.; U.S. Appl. No. 14/492,943, filed Sep. 22, 2014, entitled "Magnetic Tunnel Junction Structure for MRAM Device".

Mustafa Pinarbasi, et al.; U.S. Appl. No. 14/814,036, filed Jul. 30, 2015, entitled "Precessional Spin Current Structure for MRAM".

Data Storage Institute, R&D Hightlights Sep. 2010, "Magnetic Technology 'spintronics, media and interface'".

US 7,026,672, 04/2006, Grandis, Inc. (withdrawn).

R.H. Koch, et al. Physical Review Letters, vol. 84, No. 23, Jun. 2000 *Thermally Assisted Magnetization Reversal in Submicron-Sized Magnetic Thin Films*, pp. 5419-5422.

Lee et al., Analytical investigation of spin-transfer dynamics using a perpendicular-to-plane polarizer, Applied Physics Letters 86, pp. 022505-1 to 022505-3 (2005).

Martens et al., "Magnetic Reversal in Nanoscopic Ferromagnetic Rings", NSF grants PHY-0351964 (DLS), 2006, (23 pages).

Martens et al., "Thermally Induced Magnetic Switching in Thin Ferromagnetic Annuli", NSF grants PHY-0351964 (DLS), 2005, (11 pages).

\* cited by examiner ically limits/reduces the re-deposition of material on the sides of the MTJ pillar, preventing shunts from being formed at the edges of the tunnel barrier layer, and

METHOD FOR MANUFACTURING MTJ MEMORY DEVICE

BACKGROUND

1. Field

The present patent document relates generally to a method for manufacturing MRAM devices, and, more particularly, to a method for manufacturing MTJ pillars for MTJ memory devices with improved density and quality specifications.

2. Description of the Related Art

Magnetoresistive random-access memory ("MRAM") is a non-volatile memory technology that stores data through magnetic storage elements. These elements are two ferromagnetic plates or electrodes that can hold a magnetic field and are separated by a non-magnetic material (i.e., a barrier layer), such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off.

MRAM devices are considered to be the next generation structures for a wide range of memory applications. The magnetic tunnel junction ("MTJ") layer stack and processing of the MTJ layer stack into pillars for MTJ memory devices are the two most critical aspects of the MRAM technology development. However, under conventional manufacturing schemes, forming pillar like MTJ devices without shunts and at a DRAM-like density is not manufacturable.

One limitation of the current processing technology is illustrated in FIG. 1. Once the photomask and hard mask are formed, the MTJ stack is etched using directional ion beams 110. During the etching process, the material that is removed from the base of the MTJ pillar 120 is re-deposited on the side of the MTJ pillar. This re-deposited material 130 contains metals such as iridium (Ir), platinum (Pt), ruthenium (Ru) metals and that do not form insulating oxides. As a result, their presence at the edges 122 of the barrier layer of the MTJ pillar 120 is significantly detrimental to the operation of the device. Specifically, this conductive re-deposited material 130 shorts the barrier and renders the tunnel junction of the MTJ structure inoperable. Conventional manufacturing processes alleviate this problem by performing side cleaning at very high ion beam angles (usually 70°) to remove the re-deposited material 130 on the sides 122 of the barrier layer of the MTJ pillar. However, this removal process puts unacceptable limits on the device density. For example, as shown in FIG. 1, for an MTJ device structure of 100 nm, the ion beam cleaning requires spacing of approximately 270 nm, which is significantly larger than the density requirements of 100 nm or less between adjacent MTJ pillars. Furthermore, sidewall cleaning at high ion beam angles significantly increases the beam damage to the thin MTJ layers, which only further compromises the MTJ performance. Although the MRAM development companies have spent significant resources and effort to develop ion beam cleaning techniques as well as other manufacturing processes, such as reactive ion etching, the existing manufacturing processes have not lead to a satisfactory process and tooling technology for MTJ pillars.

Accordingly, there is a strong felt need for a manufacturing method for MTJ pillars for a MTJ memory device that meets density and quality requirements for future MTJ memory product application.

SUMMARY

MTJ pillar formation processing steps and a manufacturing method is provided that addresses these critical MRAM device processing issues being faced today. The manufacturing method contemplated herein uses a combination of thin insulator layers and ion beam etching and reactive ion etching to define MTJ pillars. The method includes depositing multiple MTJ layers on a substrate, depositing a hard mask on the substrate and coating a photoresist on the hard mask. Further, alternating steps of reactive ion etching and ion beam etching are performed to isolate MTJ pillars and expose side surfaces of the MTJ layers. An insulating layer is applied to protect the side surfaces of the MTJ layers. A second insulating layer is deposited before the device is planarized using chemical mechanical polishing.

The disclosed method solves the problem of conventional MTJ device manufacturing by reducing the re-deposition of material on the sides of the MTJ pillar, preventing shunts from being formed at the edges of the tunnel barrier layer, and reducing damage caused at the edges of the MTJ layers by using high angle ion beam cleaning.

Through the use of discrete ion beam etching steps, the manufacturing method disclosed herein limits or eliminates the need for high angle ion beam cleaning, provides a processing method that solves one of the biggest manufacturing hurdles with MTJ MRAM technology—processing of high density or closely spaced MTJ pillars—and enables the use of current process tooling/technology to define the MTJ pillars.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ device manufacturing methods described herein.

The figures are not necessarily drawn to scale and the elements of similar structures or functions are generally represented by like reference numerals for illustrative purposes throughout the figures. The figures are only intended to facilitate the description of the various embodiments described

DETAILED DESCRIPTION

A method for manufacturing magnetic tunnel junction ("MTJ") memory devices is disclosed herein. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the MTJ memory device and the method for manufacturing the same as described herein. The various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Figure 1:
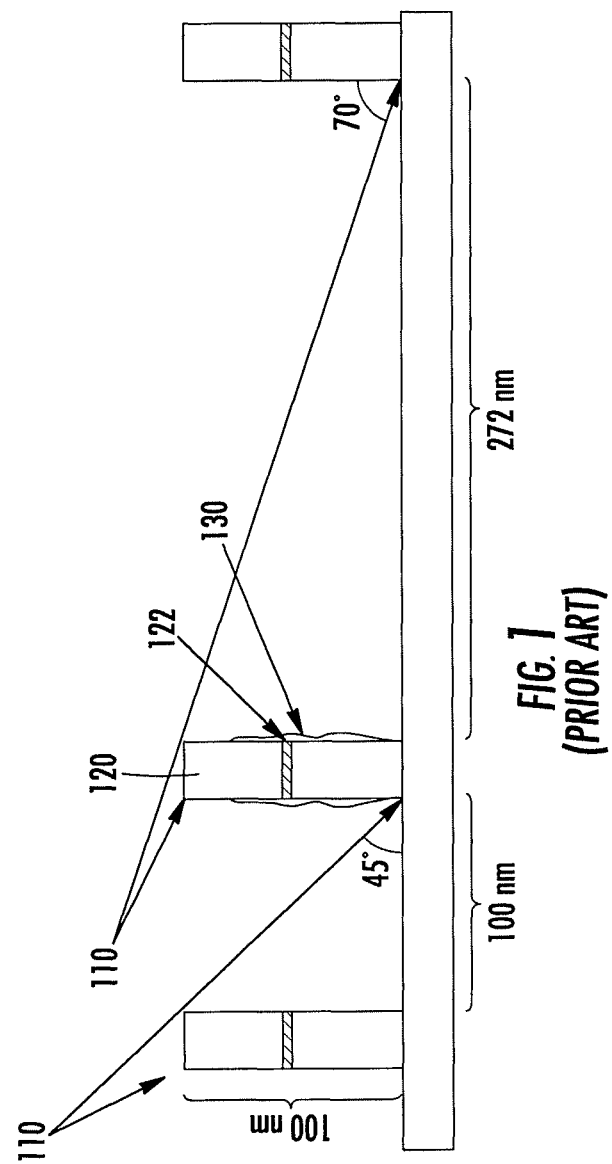
FIG. 1 illustrates a conventional manufacturing method of an MTJ device.
Figure 2:
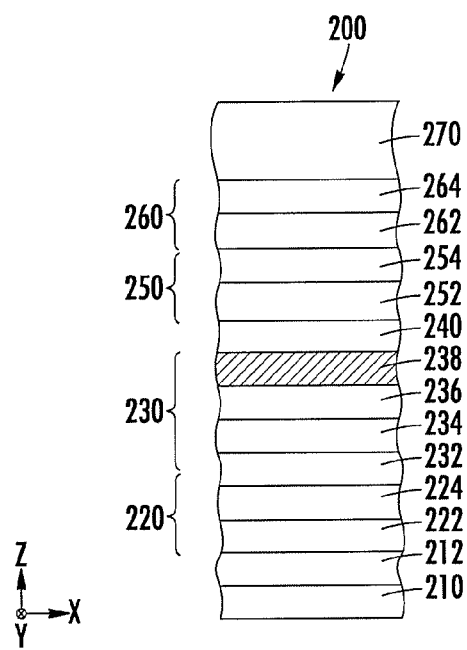
FIG. 2 illustrates an exemplary MTJ layer stack (orthogonal spin transfer MTJ) used in accordance with an exemplary embodiment of the manufacturing method described herein.

FIG. 2 illustrates an exemplary MTJ layer stack 200 for an MTJ memory device contemplated herein. The exemplary MTJ layer stack 200 is described in detail in application Ser. No. 14/242,419, filed on Apr. 1, 2014, the contents of which are hereby incorporated by reference. It should be appreciated that the exemplary manufacturing methods described herein are provided to manufacture MTJ memory devices from MTJ layer stack 200. However, the exemplary processes described herein could be applied to manufacture MTJ memory devices having alternative layer stacks.

As shown in FIG. 2, MTJ layer stack 200 includes one or more seed layers 210 provided at the bottom of stack 200 to initiate a desired crystalline growth in the above-deposited layers. Above the seed layers 210 is a pinning layer 212 and a synthetic antiferromagnetic ("SAF") structure 220. According to an exemplary embodiment, pinning layer 212 is platinum manganese PtMn alloy and SAF structure 220 is composed of three layers, layer 222, layer 224 and the reference layer 232 (discussed below). Preferably, layer 222 is a cobalt iron alloy and layer 224 is a ruthenium metal. An MTJ structure 230 is formed on top of the SAF structure 220. The MTJ structure 230 includes three separate layers, namely, reference layer 232 formed in the SAF structure 220, barrier layer 234, and free layer 236. In the exemplary embodiment, reference layer 232 and free layer 236 are cobalt-iron-boron (Co—Fe—B) alloy thin films. Furthermore, barrier layer 234 is formed from an oxide of magnesium MgO. As shown, the MgO barrier layer 234 is disposed between the reference layer 232 and free layer 236 and serves as the insulator between the two layers as discussed above.

As further shown in FIG. 2, a very thin layer of tantalum nitride TaN capping material 238 is disposed on top of the free layer 236. MTJ layer stack 200 further includes a nonmagnetic spacer 240 disposed on the TaN capping material 238 and perpendicular polarizer 250 disposed on the nonmagnetic spacer 240. Perpendicular polarizer 250 comprises two laminate layers 252 and 254 and is provided to polarize a current of electrons ("spin-aligned electrons") applied to the MTJ device, which in turn can change the magnetization orientation of free layer 236 of the MTJ structure by the torque exerted on free layer 236 from polarized electrons carrying angular momentum perpendicular to the magnetization direction of the free layer 236. The nonmagnetic spacer 240 is provided to insulate perpendicular polarizer 250 from MTJ structure 230. In addition, one or more capping layers 260 (i.e., layers 262 and 264) are provided on top of perpendicular polarizer 250 to protect the layers below of MTJ layer stack 200. A hard mask 270 is deposited over capping layers 260 and may comprise a metal such as tantalum Ta.

FIGS. 3-13 illustrate cross sectional views of selected process stages of the manufacturing of an MTJ memory device composed of MTJ layer stack 200 according to exemplary embodiment of the fabrication method disclosed herein. The cross sectional views in the figures are generally taken through the approximate center of the memory cell in a plane perpendicular to the wafer surface. It should be appreciated that although only one or a few MTJ pillars are shown in the figures, the method may be used for the fabrication of many devices in arrays on a wafer. Furthermore, a plurality of arrays with associated circuitry can be made on a single wafer, which can then be cut into smaller chips for further processing into final operational devices.

Figure 3:
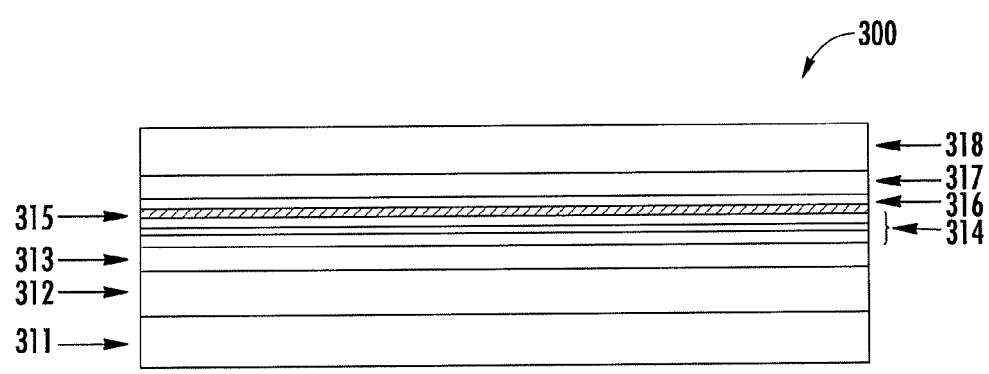
FIGS. 3-13 illustrate cross-sectional views of selected processing steps of the manufacturing method according to exemplary embodiment described herein.

FIG. 3 is a sectional view illustrating the initial layering steps for the method of manufacturing an MTJ memory device according to an exemplary embodiment. FIG. 3 illustrates a formation of an MTJ layer structure 300 that corresponds to MTJ layer stack 200 described above with respect to FIG. 2. As will be further explained, certain layers of MTJ structure 200 described above are not illustrated in detail in FIG. 3.

As shown in FIG. 3, a substrate 311 is provided and the additional layers of the MTJ layer stack are deposited on the substrate 311 using a deposition technique, such as thin film sputter deposition or the like. From bottom up, lower layers/bottom contact 312 can be deposited on the substrate 311, with lower layers/bottom contact 312 including one or more seed layers (e.g., seed layer 210 of FIG. 2) to initiate a desired crystalline growth in the above-deposited layers. Further, an antiferromagnetic layer 313 (e.g., pinning layer 212 of FIG. 2) is deposited on lower layers/bottom contact 312 and synthetic antiferromagnetic layers 314 (e.g., layers 222, 224 and reference layer 232 of FIG. 2) are deposited on antiferromagnetic layer 313. A barrier layer 315 (i.e., barrier layer 234 of FIG. 2) is deposited on the synthetic antiferromagnetic layer 314 and free layer 316 (i.e., free layer 236 of FIG. 2) is deposited on barrier layer 315. As noted above, reference layer 232, barrier layer 234, and free layer 236 collectively form the MTJ structure with a very thin TaN capping layer 238 formed on the free layer 236. As further shown in FIG. 3, upper layers 317, which can include nonmagnetic spacer 240, perpendicular polarizer 250 and one or more capping layers 260 shown in FIG. 2, are deposited on the TaN capping layer 238. Once all of the layers of the MTJ stack are deposited on the substrate 311, a hard mask 318 (e.g., hard mask 270 of FIG. 2) is deposited over the upper layers 317 and is provided to pattern the underlying layers of the MTJ layer stack using a reactive ion etch ("RIE") process, as will be described below. It is reiterated that FIGS. 2 and 3 describe the same MTJ layer stack with the only difference being that some of the individual layers shown in FIG. 2 have been combined as a single layer in FIG. 3 for clarity purposes.

After forming the layer stack of FIG. 3, the manufacturing method proceeds with a next step of coating a photoresist 319 on the hard mask 318, which is patterned or developed to leave the photoresist 319 covering a portion of the hard mask 318 where the MTJ pillar for the MTJ memory device is to be formed. Preferably, the photoresist 319 is exposed with an electron beam or other photolithography tool. The critical dimensions of the photoresist 319 can be reduced using a reductive reactive ion etching process or the like if deep ultraviolet light is to be used.

Figure 5A:
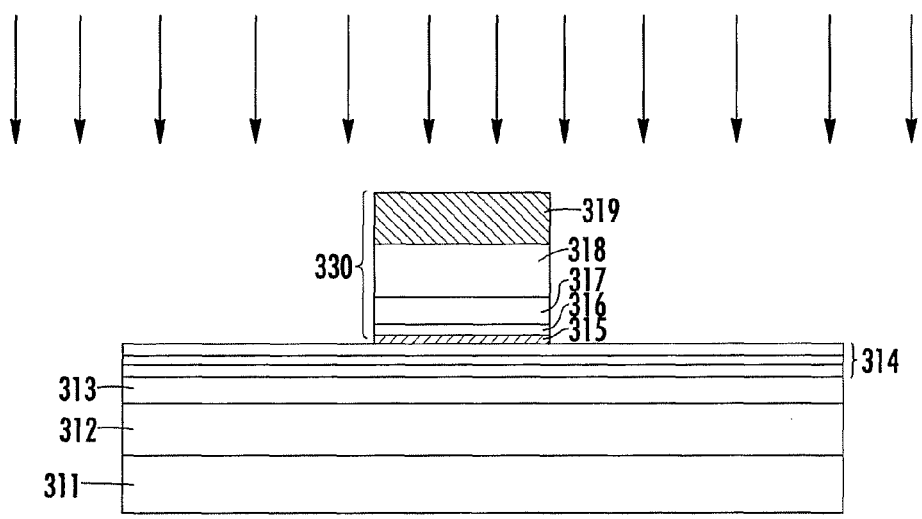

FIGS. 5A and 5B-5D illustrate two alternative embodiments for etching the MTJ layer stack to the barrier layer 315 of the MTJ structure. In particular, FIG. 5A illustrates a first embodiment of the etching step. As shown, the etching step result in formation of MTJ pillar 330 having a width defined by the width of photoresist 319. As noted above, in the exemplary embodiment, the barrier layer 315 is formed from an oxide of magnesium (MgO). It should be appreciated that processing of MTJ layer stack into MTJ pillar shaped devices requires precise control of the etching depth through all of the stack layers. The barrier resistance control is partially determined based on precision of the etching on the free layer 316 and the barrier layer 315. To eliminate shunting and to reduce the free layer 316 edge damage, stopping at the barrier layer 315 across the wafer is necessary to eliminate the re-deposition on the barrier layer 315. Furthermore, it should be appreciated that stopping at the barrier layer 315 is more difficult if more layers need to be etched to reach the free layer 316, as is the case with OST-MTJ structures.

As noted above, FIG. 5A illustrates a first embodiment in which a step of ion milling is performed to etch the MTJ layer stack to the barrier layer 315. The etching step results in formation of MTJ pillar 330 having a width defined by the width of photoresist 319. In this first embodiment, after the MTJ layer stack is ion milled, the fabrication process proceeds to a deposition of a thin conformal insulator as will be described below with respect to FIG. 6.

Figure 4:
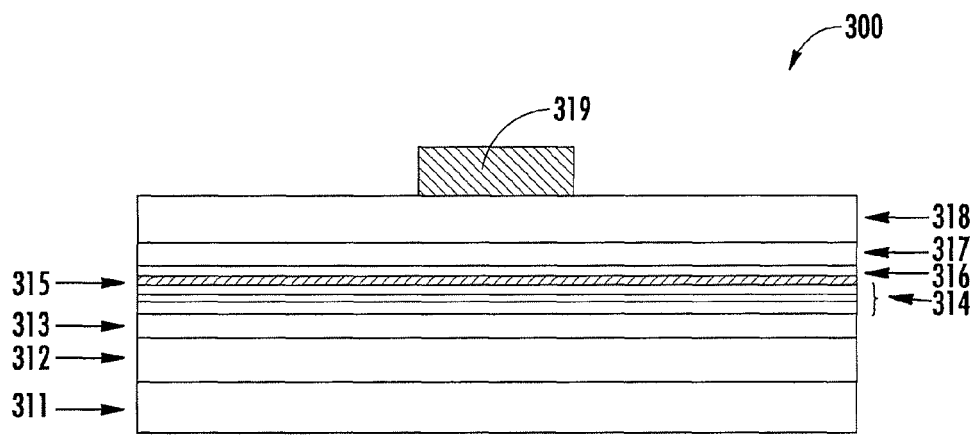
Figure 5B:
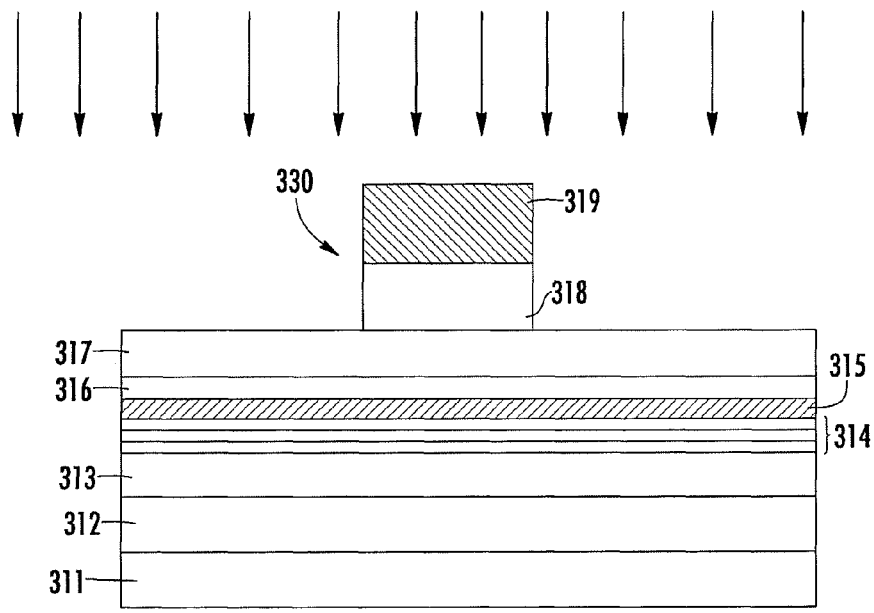
Figure 5C:
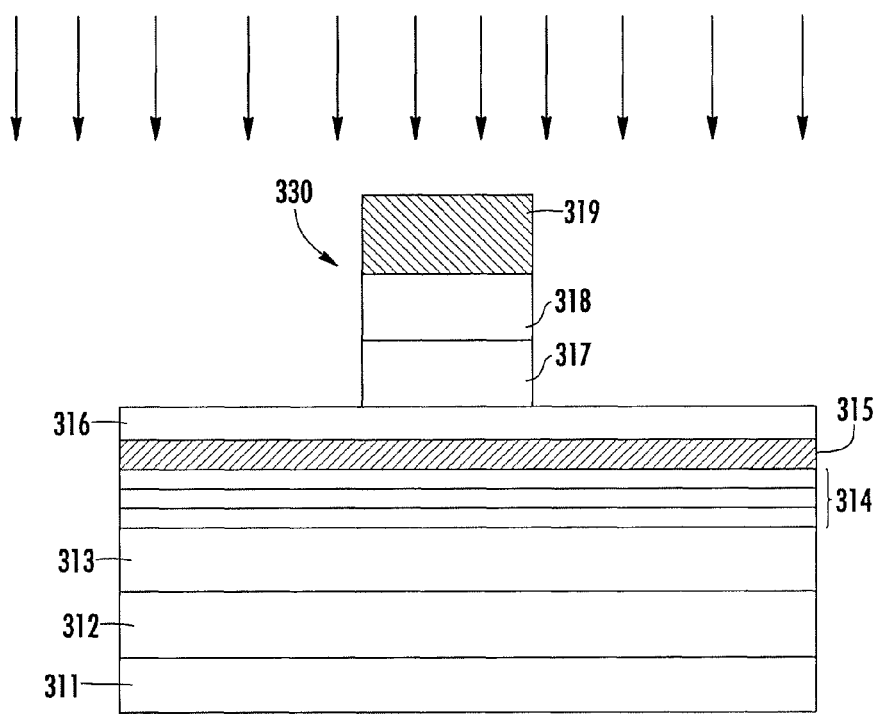
Figure 5D:
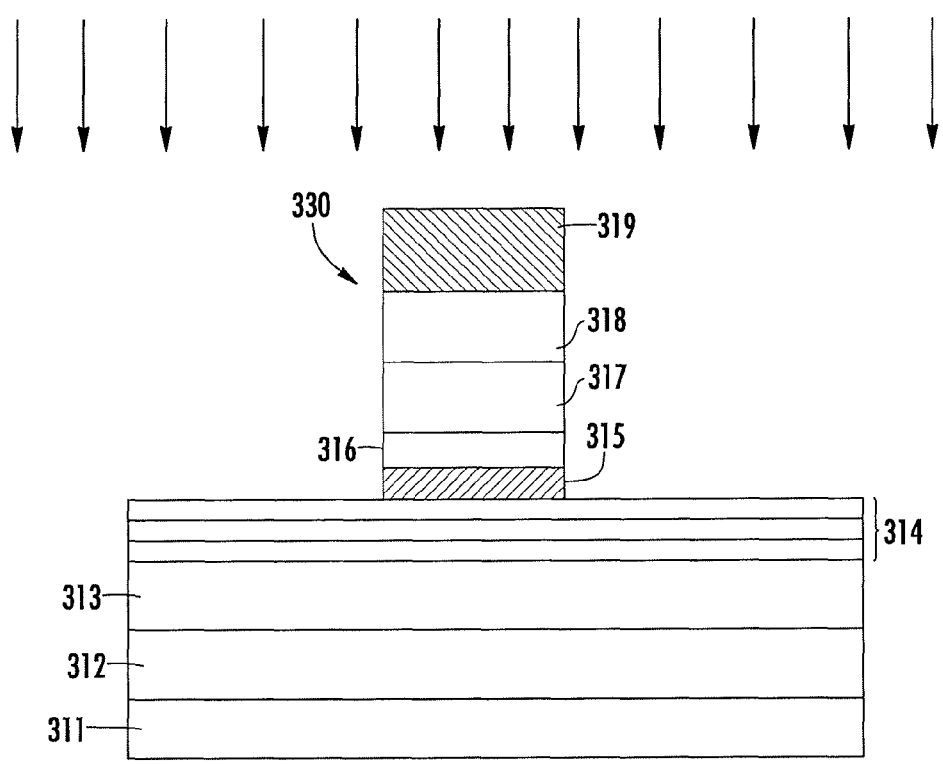

FIGS. 5B-5D illustrate a second embodiment for etching the MTJ layer stack according to the exemplary embodiment. In particular, FIGS. 5B-5D illustrate etching using multiple ion beam etching and reactive ion etching techniques (both shown in FIG. 5B-5D as downward facing arrows for illustrative purposes). First, after photoresist 319 is applied as shown in FIG. 4, the hard mask 318 is etched using reactive ion etching and the upper layers 317, including perpendicular polarizer 250, down to TaN capping layer 238 (which is illustrated as part of upper layers 317) are etched using ion beam etching. These two etching steps are collectively shown in FIG. 5B.

It should be appreciated that similar manufacturing methods for MTJ pillars have not been developed for layer stacks having perpendicular polarizers 250 and the like. Therefore, conventional manufacturing methods do not contemplate a separate ion beam etching after the photoresist 319 has been etched using reactive ion etching. In the exemplary embodiment of FIG. 5B, the ion beam etching is stopped at the TaN capping layer 238 using secondary ion mass spectroscopy ("SIMS") end point detection.

In one further embodiment after the etching shown in FIG. 5B, an insulator layer is deposited on the wafer to protect the edges of the perpendicular polarizer 250 after the ion beam etching is stopped at the end of the perpendicular polarizer 250. Once the insulator layer is deposited, reactive ion etching of the insulator is performed on planar surfaces preferably using inductively coupled plasma etchers, although it should be appreciated that the planar etching can also be performed using other chemical or physical ion beam etching techniques. The etching terminates with the removal of the insulating material on the planar surface. This isotropic etching leaves the protective insulator on the sidewalls of the perpendicular polarizer 250

Referring back to FIG. 5B, after the ion beam etching of the upper layers 317 to the TaN capping layer 238 (which is part of the upper layers 317), a reactive ion etching is performed to remove the remaining TaN capping layer 238 as shown in FIG. 5C. This reactive ion etching planarizes the wafer so that all previous etch and thickness non-uniformity is eliminated since the reactive ion etching stops at the free layer 316. As noted above, the free layer 316 (also shown in FIG. 2 as free layer 236) is composed of a cobalt-iron-boron (Co—Fe—B) alloy thin film. Thus, the free layer 316 will serve as an etch stop for this second step of reactive ion etching.

Next, as shown in FIG. 5D, a second ion beam etching can be performed to etch free layer 316 and barrier layer 315. In the exemplary embodiment, the ion milling is terminated at a desired point (i.e., the MgO barrier layer 315, also shown as barrier layer 234 in FIG. 2) using secondary ion mass spectroscopy ("SIMS") end point detection. In one embodiment, the ion beam etching can end with higher angle etching to ensure a clean and smooth MgO edge of barrier layer 315. Most importantly, the etching should be stopped before conducting material is re-deposited on sides of the barrier layer. When re-deposition cannot be prevented, it is contemplated that the re-deposited material can be removed from the sides of the barrier layer. Preferably, any small amounts of re-deposited material can be removed after the step of ion beam etching by using additional ion beams at shallow angles such as 45° or less. Preferably, the ion mill etching is terminated at the end of the MgO barrier layer 315, which will eliminate the re-deposited material at the barrier edges. In sum, FIGS. 5B-5D illustrate a second embodiment using separate etching steps using alternating ion beam etching and a reactive ion etching processes to etch the various layers to the barrier layer 315.

Figure 6:
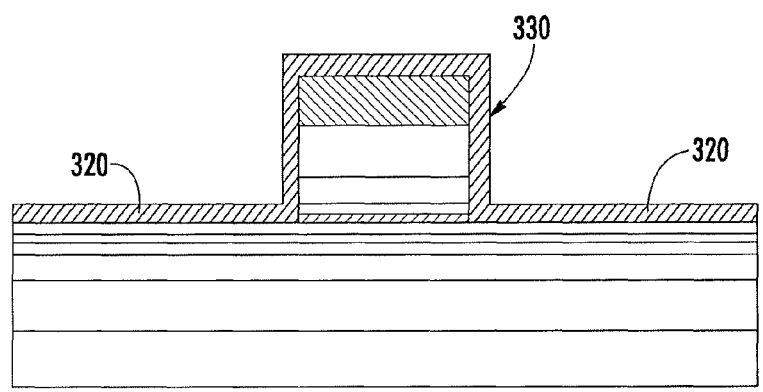

Whether etching is performed according to the first embodiment (FIG. 5A) or the second embodiment (FIGS. 5B-5D), the next step involves depositing a protective insulating layer 320 on the MTJ pillar 330 as shown in FIG. 6. Preferably, the protective insulating layer 320 is silicon dioxide ($SiO_2$), silicon nitride (SiN) or the like. In the exemplary embodiment, the protective insulating layer 320 can be conformally deposited on the MTJ pillar 330 using atomic layer deposition ("ALD") or plasma enhanced chemical vapor deposition ("PECVD") method. Importantly, the protective insulating layer 320 is deposited on both the horizontal and vertical surfaces of the MTJ pillar 330, and preferably uniformly or substantially uniformly deposited. In an exemplary embodiment, the protective insulating layer 320 preferably has a thickness between a few nanometers (e.g., 1-2 nanometers) and 100. In one embodiment, the thickness of the protective insulating layer 320 is approximately 10 nm.

It is contemplated that for the manufacturing of MTJ memory device with low density, an additional photoresist step may be formed around the pillar, either with or without the protective insulating layer, and ion beam etching can be used to isolate the MTJ devices.

Figure 7:
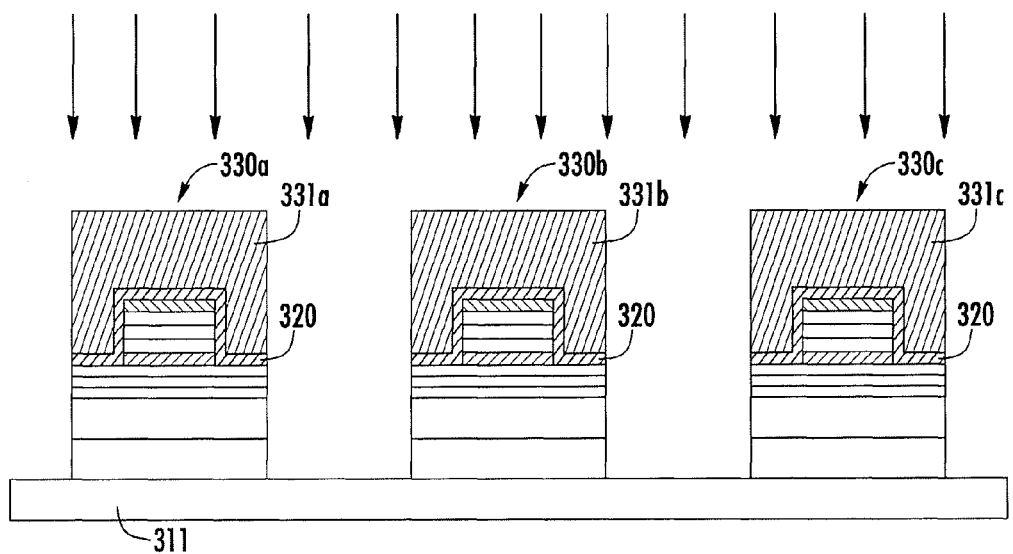

After the protective insulating layer 320 is deposited on the MTJ pillar 330 as shown in FIG. 6, the exemplary method performs one of two process steps to isolate each memory device in the MTJ structure. FIG. 7 illustrates one embodiment in which a second photoresist is formed over each MTJ pillar of the device. In particular, photoresists layers 331a, 331b and 331c are formed respectively over MTJ pillars 330a, 330b, 330c. The photoresists layers 331a, 331b and 331c are formed (i.e., deposited, patterned and developed) over the protective insulating layer 320 covering each MTJ pillars 330a, 330b, 330c. In the exemplary embodiment, it is contemplated that each photoresist layer 331a, 331b and 331c has a width that is wider than the original photoresist 319 deposited to form each MTJ pillar as discussed above. As a result, each of the lower layers/bottom contact 312, the antiferromagnetic layer 313 and the synthetic antiferromagnetic layers 314 for each MTJ pillar 330a, 330b, 330c will have a width that is approximately equal to the deposited second photoresist layers 331a, 331b and 331c, and this width is wider than the above deposited layers of each MTJ pillar (i.e., layers 315-319).

As further shown in FIG. 7, once the second photoresist layer 331a, 331b and 331c are deposited over each MTJ pillars 330a, 330b, 330c, the fabrication method according to this embodiment contemplates performing a step of ion beam etching to etch the synthetic antiferromagnetic layers 314, the antiferromagnetic layer 313 and the lower layers/bottom contact 312 that are not covered by the second photoresist layer 331a, 331b and 331c. As shown, this step of ion beam etching results in isolation between each of the MTJ pillar 330a, 330b, 330c.

Figure 8A:
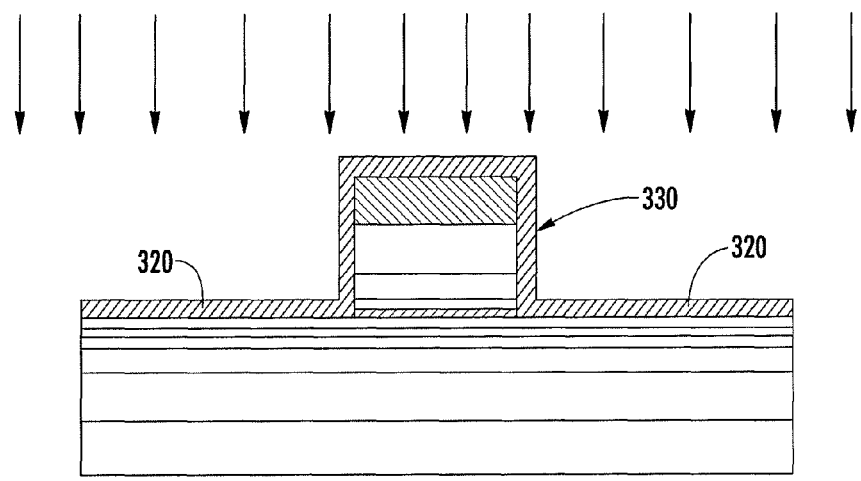
Figure 8B:
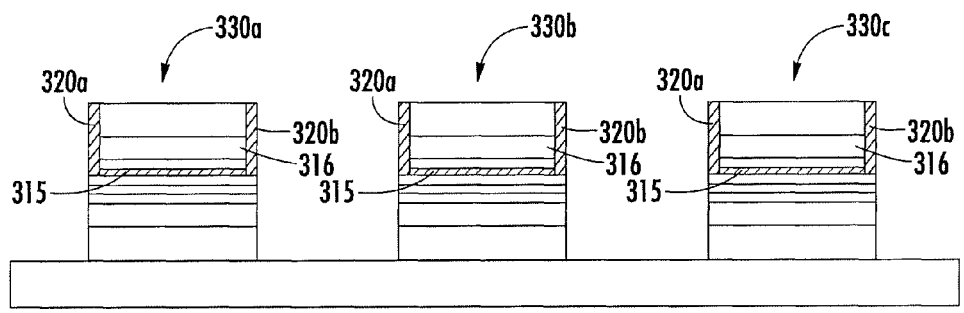

FIGS. 8A and 8B illustrate an alternative to the processing step shown in FIG. 7 in which each memory device is formed in the MTJ structure. In particular, FIG. 8A illustrates a step of ion beam etching (shown as downward facing arrows for illustrative purposes) that is performed on the MTJ pillar 330. Ion beams are applied downward onto the MTJ pillar 330 at a normal angle or near normal angle. In this step, the ion beam etching removes the protective insulating material on horizontal surfaces of the MTJ pillar 330, but does not etch the side (i.e., vertical) surfaces. As a result, the edges of the barrier layer and the free layer edges are fully protected by the protective insulating material 320a and 320b as shown in FIG. 8B. Preferably, the ion beam etching continues until each MTJ pillar is electrically isolated from each adjacent MTJ pillar.

FIG. 8B illustrates the resulting structure of the ion beam etching with three MTJ pillars 330a, 330b, 330c. Due to the protective insulating material 320a and 320b on the vertical surfaces of each of the MTJ pillars 330a, 330b, 330c, there is no re-deposition of the etched material on the barrier layer 315 or any damage during this etching step. Moreover, the materials that are hard to remove and cause shunts (e.g., iridium (Ir), platinum (Pt), ruthenium (Ru) metals and the like), are prevented from contacting the barrier layer 315, which is critical since these metals do not easily oxidize, and, therefore, significantly damage device performance when even trace amounts are re-deposited on the barrier layer 315. Because protective insulating material 320a and 320b completely isolate the edges of the barrier layer 315, any material that is re-deposited on the side of the insulating layers 320a and 320b layer cannot cause shunts. This process eliminates the need for high angle ion mill cleaning, which in turn eliminates the obstruction that conventional manufacturing processes encountered when making high density devices.

Further, it is contemplated that directional reactive etching can be used to remove the protective insulating layer 320 on the horizontal surfaces of the MTJ pillars 330a, 330b, 330c. The directional reactive etching can be followed by the ion beam etching of the remaining MTJ layers or different combinations of these techniques can be used.

Figure 9:
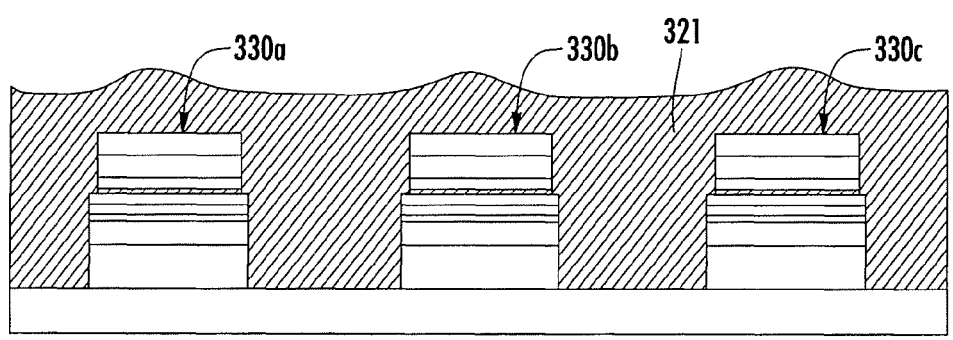

Once the ion beam etching is complete (i.e., in either FIG. 7 or FIG. 8A), a new insulating layer 321 is deposited on the MTJ pillars 330a, 330b, 330c, again using an ALD or PECVD method as shown in FIG. 9. Further, it is contemplated that the protective insulating material 320a and 320b on the sides of each MTJ pillar 330a, 330b, 330c, can be removed by reactive ion etching before the new insulating layer 321 is deposited in one embodiment.

Figure 10:
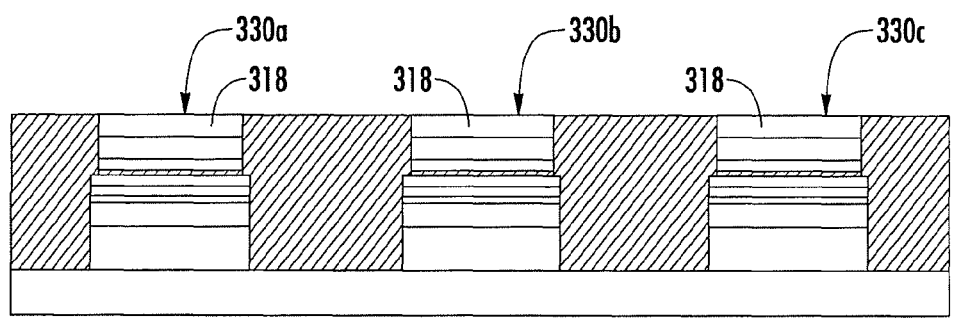

FIG. 10 illustrates the final processing step of the MTJ pillars by planarizing the wafer resulting in exposure of hard mask 318 of each MTJ pillar 330a, 330b, 330c. Such planarization may be accomplished by conventional chemical mechanical polishing. As should be understood to those skilled in the art, after the CMP step, a top contact layer can then be deposited on the wafers (not shown).

FIGS. 11A-13 illustrate yet another exemplary embodiment of the method of manufacturing an MTJ device for read head applications for hard drives. In particular, FIGS. 11A-13 illustrate alternative steps to those disclosed in FIGS. 9 and 10 discussed above. In other words, the alternative embodiment contemplates the same initial manufacturing steps discussed above that result in three isolated MTJ pillars 330a, 330b, 330c, each with a protective insulating layer 320a and 320b covering the edges of the barrier layer 315 and free layer 316. FIGS. 11A-13 follow the ion beam etching step illustrated in either FIG. 7 or FIGS. 8A-8B and provide a method for controlling a stabilizing magnetic field exerted on the free layer 316.

Figure 11A:
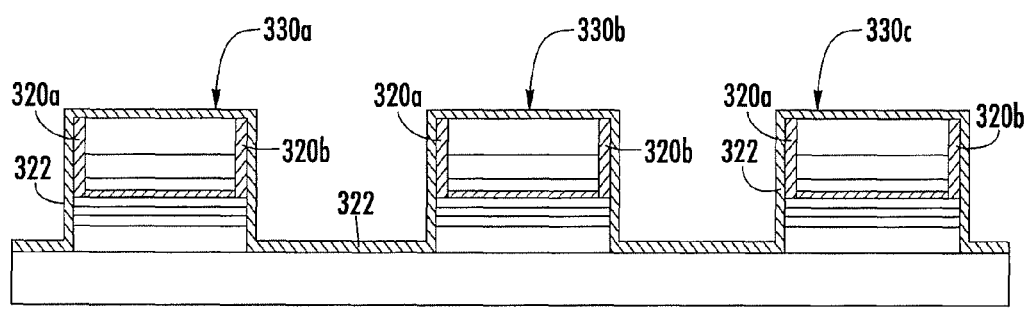
Figure 11B:
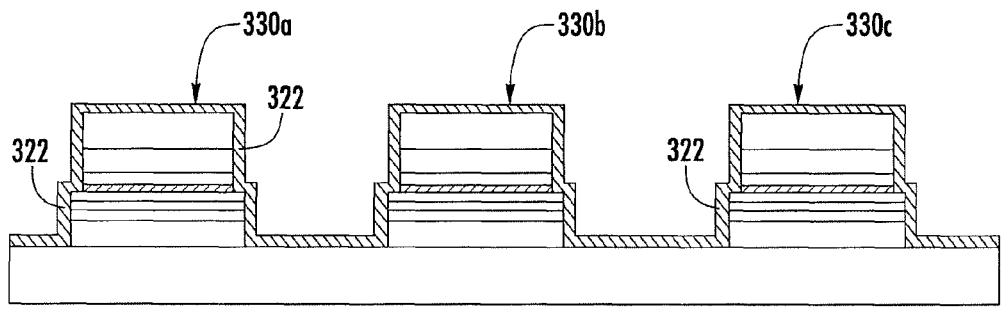

First, as shown in FIG. 11A, an insulating layer 322 is deposited over the horizontal and vertical surfaces of each MTJ pillar 330a, 330b, 330c. Preferably, the insulating layer 322 is silicon dioxide ($SiO_2$), silicon nitride (SiN) or the like. Alternatively, the existing protective insulating material 320a and 320b on the edges of the barrier layer can first be removed before insulating layer 322 is deposited, which is illustrated in FIG. 11B. Advantageously, removing the existing protective insulating material 320a and 320b before depositing the new insulating layer results in a more precise definition of the thickness of insulating layer 322 that separates free layer 316 and the stabilizing magnetic layer, as discussed below.

Figure 12:
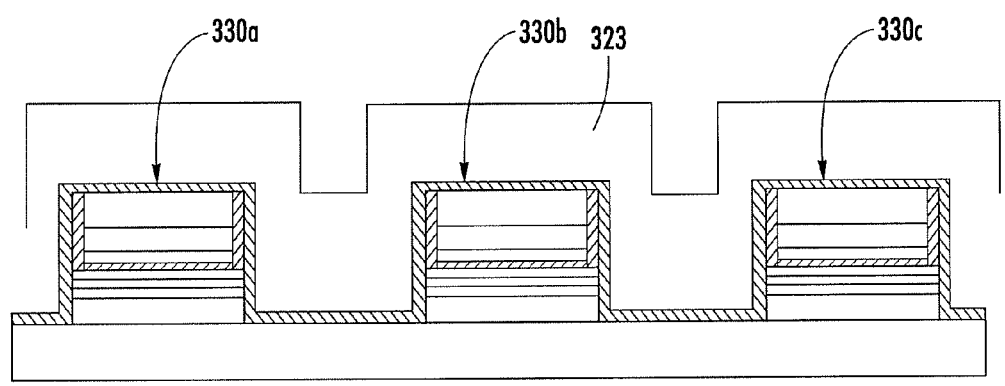
Figure 13:
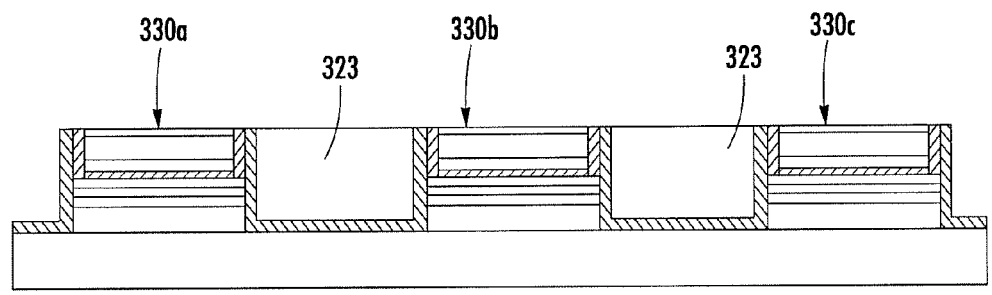

In either embodiment, following deposition of the insulating layer 322 (steps illustrated in FIG. 11A or 11B), a stabilizing magnetic layer 323 is deposited over the insulating layer 322, as shown in FIG. 12. Finally, FIG. 13 illustrates the final processing step of the MTJ read head device by planarizing the wafer resulting in exposure of hard mask 318 of each MTJ pillar 330a, 330b, 330c. Similar to the exemplary embodiment disclosed above, such planarization may be accomplished by conventional chemical mechanical polishing. As should be understood to those skilled in the art, after the CMP step, another magnetic layer to pin the magnetization of the stabilizing magnetic layer 323 and conductive leads can be deposited on the wafers (not shown). By changing and controlling the thickness of the protective insulating layer 322, the embodiment described in FIGS. 11A-13 can advantageously modify the stabilizing magnetic field that stabilizes magnetic layer 323. This manufacturing variation can be important in the operation of the MTJ read head applications for hard drives.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A method of manufacturing a magnetic tunnel junction ("MTJ") device, the method comprising:
    depositing a plurality of MTJ layers on a substrate wafer, the plurality of MTJ layers including a reference layer, a barrier layer disposed on the reference layer and a free layer disposed on the barrier layer;
    depositing a hard mask above the plurality of MTJ layers;
    forming a first photoresist layer on a portion of the hard mask;
    etching the hard mask and the plurality of MTJ layers to form an MTJ pillar under the first photoresist layer, wherein the free layer and barrier layer are etched to expose side surfaces of the free layer and the barrier layer and a surface of the reference layer adjacent to the MTJ structure;
    depositing a first insulating layer on the MTJ pillar, on the exposed side surfaces of the free layer and the barrier layer, and on the exposed surface of the reference layer;
    ion beam etching the MTJ pillar to remove a portion of the first insulating layer that is disposed on horizontal surfaces of the MTJ pillar and the exposed surface of the reference layer;
    etching the MTJ layers to the substrate wafer to electrically isolate the MTJ pillar from adjacent MTJ pillars; and
    planarizing the substrate wafer,
    wherein the step of etching the MTJ layers includes at least one reactive ion etching and at least one ion beam etching.

2. The method of manufacturing according to claim 1, wherein the step of depositing a plurality of MTJ layers further comprises:
    depositing a tantalum nitride capping layer on the free layer; and
    depositing a perpendicular polarizer on the tantalum nitride capping layer.

3. The method of manufacturing according to claim 2, wherein the step of etching the MTJ layers further comprises:
    reactive ion etching the hard mask;
    ion beam etching the perpendicular polarizer;
    reactive ion etching the tantalum nitride capping layer; and
    ion beam etching the free layer and barrier layer.

4. The method of manufacturing according to claim 3, wherein the free layer comprises a CoFeB thin film, which serves as an etch stop for the reactive ion etching of the tantalum nitride capping layer.

5. The method of manufacturing according to claim 3, wherein after the step of ion beam etching the perpendicular polarizer, a third insulating layer is conformally deposited on the MTJ pillar.

6. The method of manufacturing according to claim 5, further comprising etching the MTJ pillar to remove a portion of the third insulating layer that is disposed on horizontal surfaces of the MTJ structure.

7. The method of manufacturing according to claim 1, wherein the step of ion beam etching the MTJ pillar comprises applying ion beams at a normal angle relative to the substrate wafer.

8. The method of manufacturing according to claim 1, further comprising conformally depositing a second insulating layer on the MTJ pillar after the step of ion beam etching the MTJ pillar.

9. The method of manufacturing according to claim 1, wherein the barrier layer comprises an oxide of magnesium.

10. The method of manufacturing according to claim 3, further comprising stopping the ion beam etching of the barrier layer using secondary ion mass spectroscopy end point detection.

11. The method of manufacturing according to claim 1, further comprising forming a second photoresist layer on the first insulating layer on the MTJ pillar before the step of ion beam etching the MTJ pillar.

12. The method of manufacturing according to claim 11, wherein the second photoresist layer has a width over the MTJ pillar that is larger than a width of the first photoresist layer.

13. A method of manufacturing a magnetic tunnel junction ("MTJ") device, the method comprising:
    depositing at least one lower layer on a substrate wafer;
    depositing an anti-ferromagnetic layer on the at least one lower layer;
    depositing a synthetic antiferromagnetic structure on the anti-ferromagnetic layer, the synthetic antiferromagnetic structure including a reference layer;
    depositing a barrier layer on the reference layer;
    depositing a free layer on the barrier layer;
    depositing a tantalum nitride capping layer on the free layer;
    depositing at least one upper layer on the tantalum nitride capping layer;
    depositing a hard mask on the at least one upper layer;
    forming a first photoresist layer on a portion of the hard mask;
    reactive ion etching the hard mask;
    ion beam etching the at least one upper layer;
    reactive ion etching the tantalum nitride capping layer;
    ion beam etching the free layer and barrier layer to expose side surfaces of the free layer and barrier layer and a surface of the reference layer adjacent to the side surfaces of the barrier layer;
    depositing a first insulating layer on the MTJ pillar, on the exposed side surfaces of the free layer and the barrier layer, and on the exposed surface of the reference layer;
    ion beam etching at an angle normal relative to the substrate wafer to isolate at least one MTJ pillar;
    depositing a second insulating layer; and
    planarizing the substrate wafer.

14. The method of manufacturing according to claim 13, further comprising conformally depositing a third insulating layer after the step of ion beam etching the at least one upper layer.

15. The method of manufacturing according to claim 14, further comprising a further step of reactive ion etching to remove horizontal surfaces of the third insulating layer.

16. The method of manufacturing according to claim 15, further comprising coating a second photoresist layer on the first insulating layer on the MTJ pillar before the step of ion beam etching the MTJ pillar.

17. The method of manufacturing according to claim 16, wherein the second photoresist layer has a width over the MTJ pillar that is larger than a width of the first photoresist layer.

18. A method of manufacturing a magnetic tunnel junction ("MTJ") device, the method comprising:
    depositing a plurality of MTJ layers on a substrate wafer, the plurality of MTJ layers including a reference layer, a barrier layer disposed on the reference layer and a free layer disposed on the barrier layer;
    depositing a hard mask above the plurality of MTJ layers;
    forming a first photoresist layer on a portion of the hard mask;

etching the hard mask and the plurality of MTJ layers to form an MTJ pillar under the first photoresist layer, wherein the free layer and barrier layer are etched to expose side surfaces of the free layer and barrier layer and a surface of the reference layer adjacent to the MTJ pillar;

depositing a first insulating layer on the MTJ pillar, on the exposed side surfaces of the free layer and the barrier layer, and on the exposed surface of the reference layer;

forming a second photoresist layer on the first insulating layer on the MTJ pillar and a portion of the exposed surface of the reference layer;

ion beam etching at an angle normal relative to the substrate wafer to isolate the MTJ pillar;

depositing a second insulating layer; and planarizing the substrate wafer.

19. The method of manufacturing according to claim 18, wherein the second photoresist layer has a width over the MTJ pillar that is larger than a width of the first photoresist layer.

20. A method of manufacturing a magnetic tunnel junction ("MTJ") device for a read head application, the method comprising:

depositing a plurality of MTJ layers on a substrate wafer, the plurality of MTJ layers including a reference layer, a barrier layer disposed on the reference layer and a free layer disposed on the barrier layer;

depositing a hard mask above the plurality of MTJ layers;

forming a first photoresist layer on a portion of the hard mask;

etching the hard mask and the plurality of MTJ layers to form an MTJ pillar under the first photoresist layer, wherein the free layer and barrier layer are etched to expose side surfaces of the free layer and barrier layer and a surface of the reference layer adjacent to the MTJ structure;

depositing a first insulating layer on the MTJ pillar, on the exposed side surfaces of the free layer and the barrier layer, and on the exposed surface of the reference layer;

ion beam etching the MTJ pillar to remove a portion of the first insulating layer that is disposed on horizontal surfaces of the MTJ pillar and the exposed surface of the reference layer;

depositing a second insulating layer on the MTJ pillar;

depositing a stabilizing magnetic layer on the second insulating layer;

and planarizing the substrate wafer, wherein the etching step includes at least one reactive ion etching and at least one ion beam etching.

* * * * *